(12) United States Patent
Shin et al.

(10) Patent No.: US 12,489,450 B2
(45) Date of Patent: Dec. 2, 2025

(54) INJECTION-LOCKED CLOCK MULTIPLIER AND ITS OPERATION THEREOF

(71) Applicant: SEOUL NATIONAL UNIVERSITY R&DB FOUNDATION, Seoul (KR)

(72) Inventors: Jiwon Shin, Seoul (KR); Woo-Seok Choi, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 58 days.

(21) Appl. No.: 18/635,220

(22) Filed: Apr. 15, 2024

(65) Prior Publication Data

US 2024/0348255 A1 Oct. 17, 2024

(30) Foreign Application Priority Data

Apr. 14, 2023 (KR) ........................ 10-2023-0049303

(51) Int. Cl.
*H03D 3/24* (2006.01)
*H03L 7/081* (2006.01)
*H03L 7/099* (2006.01)

(52) U.S. Cl.
CPC .......... *H03L 7/0992* (2013.01); *H03L 7/0814* (2013.01)

(58) Field of Classification Search
CPC ......... H03L 7/24; H03L 19/14; H03L 7/0995; H03L 7/083; H03L 7/089; H03L 7/0891; H03K 5/00006; H03K 2995/00156; H03B 5/124; H03B 5/1212; H04L 7/033
USPC ................ 375/376, 373; 455/103, 127, 307; 327/156; 331/18, 177 R
See application file for complete search history.

(56) References Cited

U.S. PATENT DOCUMENTS

| 9,564,880 | B2 | 2/2017 | Stengel et al. | |
| 10,326,457 | B2* | 6/2019 | Perez | H03L 7/0816 |
| 2014/0021987 | A1* | 1/2014 | Okada | H03L 7/083 |
| | | | | 327/156 |
| 2018/0226979 | A1* | 8/2018 | Kim | H03L 7/083 |
| 2019/0058480 | A1* | 2/2019 | Kuan | H03L 7/0992 |
| 2019/0115925 | A1* | 4/2019 | Shu | H03L 7/197 |
| 2021/0191288 | A1* | 6/2021 | Ishido | G03G 15/065 |
| 2021/0218408 | A1* | 7/2021 | Hong | H03L 7/0995 |

(Continued)

FOREIGN PATENT DOCUMENTS

| KR | 10-1890512 B1 | 8/2018 |
| KR | 10-2010434 B1 | 8/2019 |

*Primary Examiner* — Khai Tran
(74) *Attorney, Agent, or Firm* — NSIP Law

(57) ABSTRACT

An injection-locked clock multiplier includes an oscillator control unit configured to output an injection clock signal with a frequency of N times a reference clock signal, an error detector configured to detect a frequency error indicating whether a frequency of the injection clock signal corresponds to the N times the frequency of the reference clock signal in a first operation mode and configured to detect an error due to injection path non-ideality from the injection clock signal in a second operation mode, and an error adjuster configured to receive one of information on the frequency error and information on the error due to the injection path non-ideality from the error detection unit and configured to adjust an operation frequency of the oscillator based on the frequency error or configured to adjust an operation cycle of the oscillator based on the error due to the injection path non-ideality.

12 Claims, 7 Drawing Sheets

(56) References Cited

U.S. PATENT DOCUMENTS

2023/0119570 A1* 4/2023 Bhat ..................... H03B 5/124
　　　　　　　　　　　　　　　　　　　　331/8

* cited by examiner

10 frequency/phase error detection using rising edge injection path non-ideality detection using falling edge when frequency of injection clock signal is lower than target frequency when there is no error when there is injection path non-ideality when there is not injection path non-ideality

INJECTION-LOCKED CLOCK MULTIPLIER AND ITS OPERATION THEREOF

CROSS REFERENCE TO RELATED APPLICATIONS

This application claims the benefit under 35 USC 119 (a) of Korean Patent Application No. 10-2023-0049303, filed with the Korean Intellectual Property Office on Apr. 14, 2023, the disclosure of which is incorporated herein by reference in its entirety.

FIELD OF THE INVENTION

The present disclosure relates to an injection-locked clock multiplier and an operating method of the injection-locked clock multiplier.

BACKGROUND

A clock generator widely used in wireless and wired communications uses an injection-locked clock multiplier. The injection-locked clock multiplier corrects an instantaneous phase change of an oscillator by repeatedly injecting a reference signal, thereby generating a clock signal with a frequency equal to N times a reference clock.

In particular, the present disclosure proposes a clock generator using a ring oscillator that operates at a low voltage. As semiconductor processes become more fine day by day, there is considerable difficulty in reducing an area of a clock generator circuit including an analog circuit. In order to solve the problem, development of a clock generator based on a ring oscillator is in progress, but there is a difficulty due to high noise levels.

In addition, the difficulty is maximized when operating at a low voltage to reduce power consumption. The present disclosure proposes a new structure that solves the problem occurring at a low voltage.

PATENT PRIOR ART

An example of related art includes Korea Patent No. 10-1890512 (Title of invention: APPARATUS AND METHOD FOR INJECTION LOCKED CLOCK MULTIPLY)

CONTENTS OF THE DISCLOSURE

The Problem Trying to Solve

The present disclosure provides an injection-locked clock multiplier that may detect both a frequency error occurring during operation of the injection-locked clock multiplier and an error due to injection path non-ideality, and an operating method of the injection-locked clock multiplier.

However, technical problems to be solved by the present embodiment is not limited to the technical problem described above, and other technical problems may exist.

Means of Solving the Problem

According to a first aspect of the present disclosure, an injection-locked clock multiplier includes an oscillator control unit configured to output an injection clock signal with a frequency of N times (N is a natural number) a reference clock signal through an oscillator, an error detector configured to detect a frequency error indicating whether a frequency of the injection clock signal corresponds to the N times the frequency of the reference clock signal in a first operation mode and configured to detect an error due to injection path non-ideality from the injection clock signal in a second operation mode, and an error adjuster configured to receive one of information on the frequency error and information on the error due to the injection path non-ideality from the error detection unit and configured to adjust an operation frequency of the oscillator through the oscillator control unit based on the frequency error or configured to adjust an operation cycle of the oscillator through the oscillator control unit based on the error due to the injection path non-ideality.

According to a second aspect of the present disclosure, a method of operating an injection-locked clock multiplier includes generating an injection clock signal with a frequency of N times (N is a natural number) a reference clock signal through an oscillator, detecting a frequency error indicating whether a frequency of the injection clock signal corresponds to the N times the frequency of the reference clock signal in a first operation mode, detecting an error due to injection path non-ideality from the injection clock signal in a second operation mode, adjusting an operation frequency of the oscillator based on the frequency error detected in the first operation mode, and adjusting an operation cycle of the oscillator based on the error due to the injection path non-ideality detected in the second operation mode.

Effects of the Invention

According to a configuration of the present disclosure, frequency error detection and error detection due to injection path non-ideality may be performed separately from each other. In particular, because only one delayer and one phase detector are used to construct the error detection circuit, the influence of mismatch that may occur at a low voltage is greatly reduced, and a clock generator that operates in a small area or low-power environment may be easily constructed.

In addition, a noise level may be reduced by removing the influence of frequency offset occurring in the general frequency tracking path through frequency error detection.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
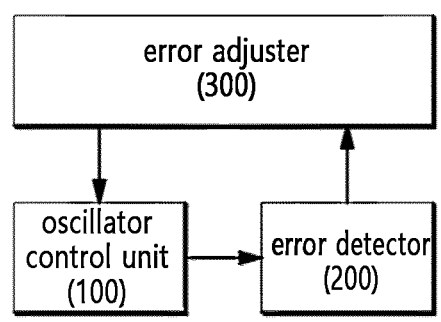
FIG. 1 illustrates a block diagram of an injection-locked clock multiplier according to an embodiment of the present disclosure.

Hereinafter, embodiments of the present disclosure will be described in detail with reference to the accompanying drawings such that those skilled in the art in which the present disclosure belongs may easily practice the present disclosure. However, the present disclosure may be implemented in many different forms and is not limited to the embodiments described herein. In addition, in order to clearly describe the present disclosure, parts irrelevant to the description are omitted in the drawings, and similar reference numerals are attached to similar parts throughout the specification.

When it is described that a portion is "connected" to another portion throughout the specification, this includes not only a case where the portion is "directly connected" to another portion but also a case where the portion is "electrically connected" to another portion with another component therebetween. In addition, when it is described that a portion "includes" a certain component, this means that the portion may further include another component without excluding another component unless otherwise stated.

Figure 2:
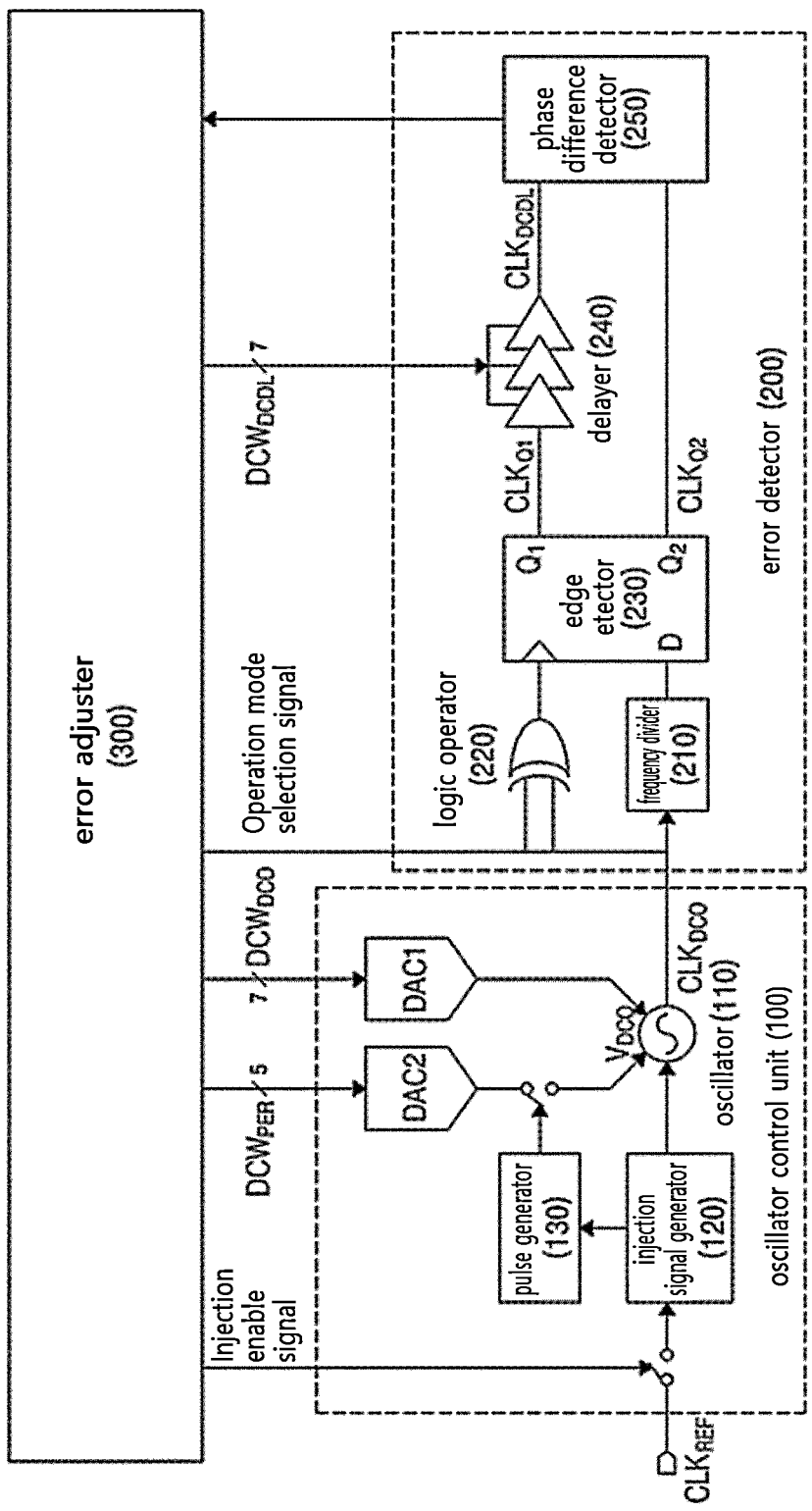
FIG. 2 is a circuit diagram illustrating a detailed configuration of an injection-locked clock multiplier according to an embodiment of the present disclosure.
Figure 3:
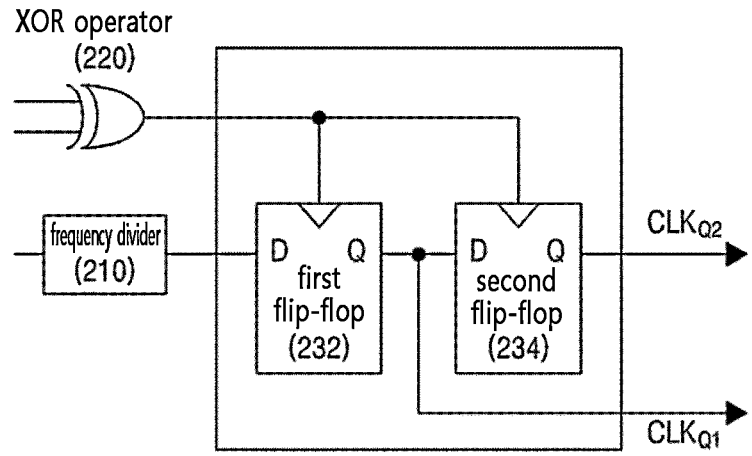
FIG. 3 is a circuit diagram illustrating a detailed configuration of an edge detector according to an embodiment of the present disclosure.

FIG. 1 illustrates a block diagram of an injection-locked clock multiplier according to an embodiment of the present disclosure, FIG. 2 is a circuit diagram illustrating a detailed configuration of the injection-locked clock multiplier according to the embodiment of the present disclosure, and FIG. 3 is a circuit diagram illustrating a detailed configuration of an edge detector according to an embodiment of the present disclosure.

The injection-locked clock multiplier 10 includes an oscillator control unit 100, an error detector 200, and an error adjuster 300.

The oscillator control unit 100 includes an oscillator 110, an injection signal generator 120, and a pulse generator 130. The oscillator control unit 100 outputs an injection clock signal with a frequency of N times the reference clock signal (N is a natural number) through the oscillator 110. In this case, the oscillator 110 may include a ring oscillator. In addition, the oscillator control unit 100 repeatedly injects a reference clock signal to correct an instantaneous phase change of the oscillator 110.

The oscillator control unit 100 repeatedly injects a reference clock signal $CLK_{REF}$ through the injection signal generator 120 according to an injection enable signal output from the error adjuster 300, and the oscillator 110 outputs an injection clock signal $CLK_{DCO}$ with a frequency of N times the reference clock signal $CLK_{REF}$.

In this case, the oscillator control unit 100 adjusts an operation of the oscillator based on an operation frequency adjustment signal $DCW_{DCO}$ of the oscillator 110 and an operation cycle adjustment signal $DCW_{PER}$ of the oscillator 110 which are transmitted from the error adjuster 300. That is, the oscillator control unit 100 and adjusts a frequency error of the injection clock signal $CLK_{DCO}$ by adjusting an operation frequency of the oscillator 110 according to the operation frequency adjustment signal $DCW_{DCO}$ of the oscillator 110. In addition, the oscillator control unit 100 adjusts an error caused by the injection path non-ideality of the injection clock signal $CLK_{DCO}$ by adjusting an operation cycle of the oscillator 110 according to the operation cycle adjustment signal $DCW_{PER}$ of the oscillator 110. Meanwhile, the operation frequency adjustment signal $DCW_{DCO}$ and the operation cycle adjustment signal $DCW_{PER}$ output from the error adjuster 300 are converted into analog signals respectively by a first digital-to-analog converter DAC1 and a second digital-to-analog converter DAC2, and are transmitted to the oscillator 110. In addition, the pulse generator 130 receives an output signal of the injection signal generator 120 and generates a pulse when the injection signal generator 120 is activated, and according to the pulse, the second digital-to-analog converter DAC2 is activated.

Next, the error detector 200 operates alternately between an operation mode for detecting a frequency error and an operation mode for detecting an error due to injection path non-ideality. That is, the error detector 200 detects a frequency error indicating whether a frequency of the injection clock signal $CLK_{DCO}$ corresponds to N times the frequency of the reference clock signal $CLK_{REF}$ in the first operation mode, and detects an error due to the injection path non-ideality from the injection clock signal $CLK_{DCO}$ in the second operation mode. In this case, an operation mode selection signal for distinguishing a first operation mode and a second operation mode is output from the error adjuster 300, and the error detector 200 may distinguish the first and second operation modes based on the operation mode selection signal.

Meanwhile, the first operation mode for detecting a frequency error and the second operation mode for detecting an error due to injection path non-ideality may be executed at a ratio of 15:1. That is, while the operation mode selection signal for executing the first operation mode is activated 15 times, the operation mode selection signal for executing the second operation mode may be activated once. However, the ratio is an example and may be changed according to an operator's selection.

The error detector 200 includes an edge detector 230 that receives the operation mode selection signal for distinguishing the first operation mode and the second operation mode from the error adjuster 300 and distinguishes the first and second operation modes according to the operation mode selection signal. The edge detector 230 distinguishes the first operation mode and the second operation mode according to the operation mode selection signal. In addition, the error detector 200 further includes a frequency divider 210, a logic operator 220, a delayer 240, and a phase difference detector 250.

The frequency divider 210 divides a frequency of the injection clock signal $CLK_{DCO}$ and outputs a frequency-divided injection clock signal. For example, when generating an injection clock signal of N times, the frequency divider 210 may divide a frequency of the injection clock signal by 1/N and output the frequency-divided injection clock signal.

The logic operator 220 performs a logical operation on the operation mode selection signal and the injection clock signal $CLK_{DCO}$ and outputs a logically-operated signal as an operation clock signal of the edge detector 230. In this case, an XOR operator may be used as the logic operator 220.

The edge detector 230 includes a first flip-flop 232 that operates in synchronization with the result of the XOR operation of the operation mode selection signal and the injection clock signal, receives the frequency-divided injection clock signal as data, and outputs a first clock signal $CLK_{Q1}$, and a second flip-flop 234 that operates in synchronization with a result of an XOR operation of the operation mode selection signal and the injection clock signal, receives the first clock signal $CLK_{Q1}$ as data, and outputs a second clock signal $CLK_{Q2}$. That is, the first flip-flop 232 and the second flip-flop 234 operate in synchronization with an output of the logic operator 220. A detailed operation process of the edge detector 230 will be described in detail below with reference to a sequence diagram.

The delayer 240 delays the first clock signal $CLK_{Q1}$ of the edge detector 230 by a predetermined time. For example, the first clock signal $CLK_{Q1}$ is set to delay by one cycle of the injection clock signal $CLK_{DCO}$. The delayer 240 may be implemented in the form of a digitally-controlled delay line (DCDL), and a delay time may be adjusted by delay time information $DCW_{DCDL}$ transmitted by the error adjuster 300.

The phase difference detector 250 compares a phase of the first clock signal $CLK_{Q1}$ with a phase of the second clock signal $CLK_{Q2}$ delayed by a predetermined time through the delayer 240 and transmits a result of the comparison to the error adjuster 300.

Figure 4A:
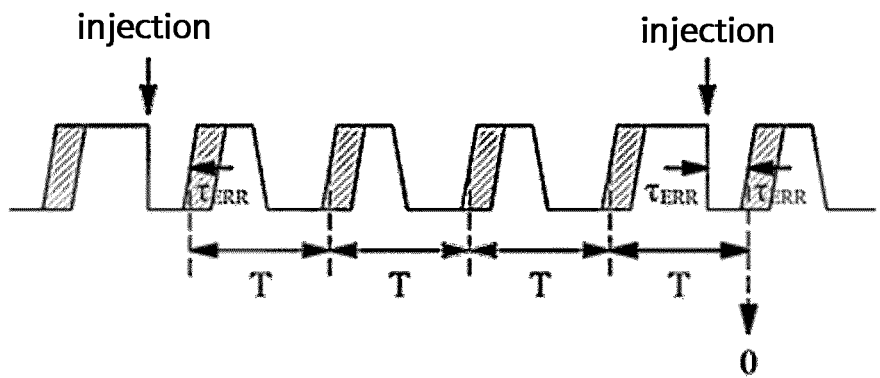
FIGS. 4A and 4B are diagrams conceptually illustrating a process of detecting a frequency error and injection path non-ideality, according to an embodiment of the present disclosure.
Figure 4B:
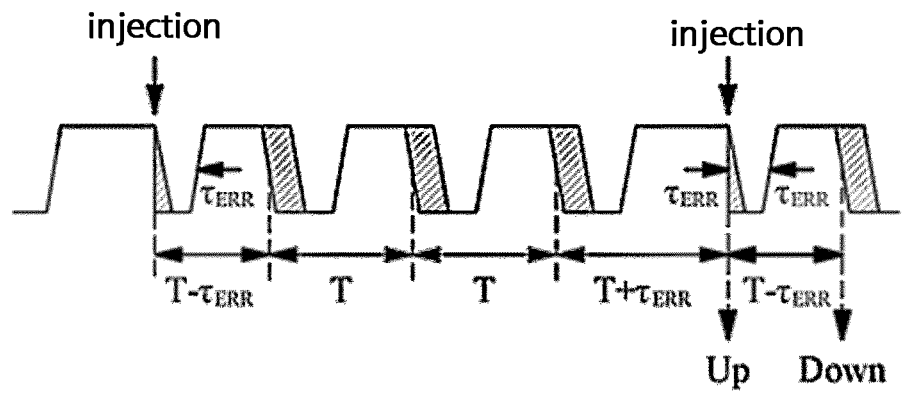

FIGS. 4A and 4B are diagrams conceptually illustrating a process of detecting a frequency error and injection path non-ideality, according to an embodiment of the present disclosure.

In order to solve problems of the related art, the present disclosure separately performs frequency error detection and injection path non-ideality detection. To this end, different detections are performed based on rising and falling edges of a clock signal as illustrated in FIGS. 4A and 4B.

FIGS. 4A and 4B illustrate examples of waveforms of an injection clock signal. In this case, an error due to injection path non-ideality occur in a cycle based on an edge (a falling edge in the drawings) where injection occurs, and accordingly, it is preferable to detect an error due to injection path non-ideality. In addition, a frequency error or phase error occurs in a cycle based on an edge (a rising edge) opposite to the edge where injection occurs, and accordingly, it is preferable to detect the frequency error. Accordingly, in the present disclosure, frequency and phase errors are detected at the rising edge, and injection path non-ideality is detected at the falling edge. As such, the present disclosure proposes a device that separates each error detection section and minimizes an error by detecting an influence of each error.

Figure 5:
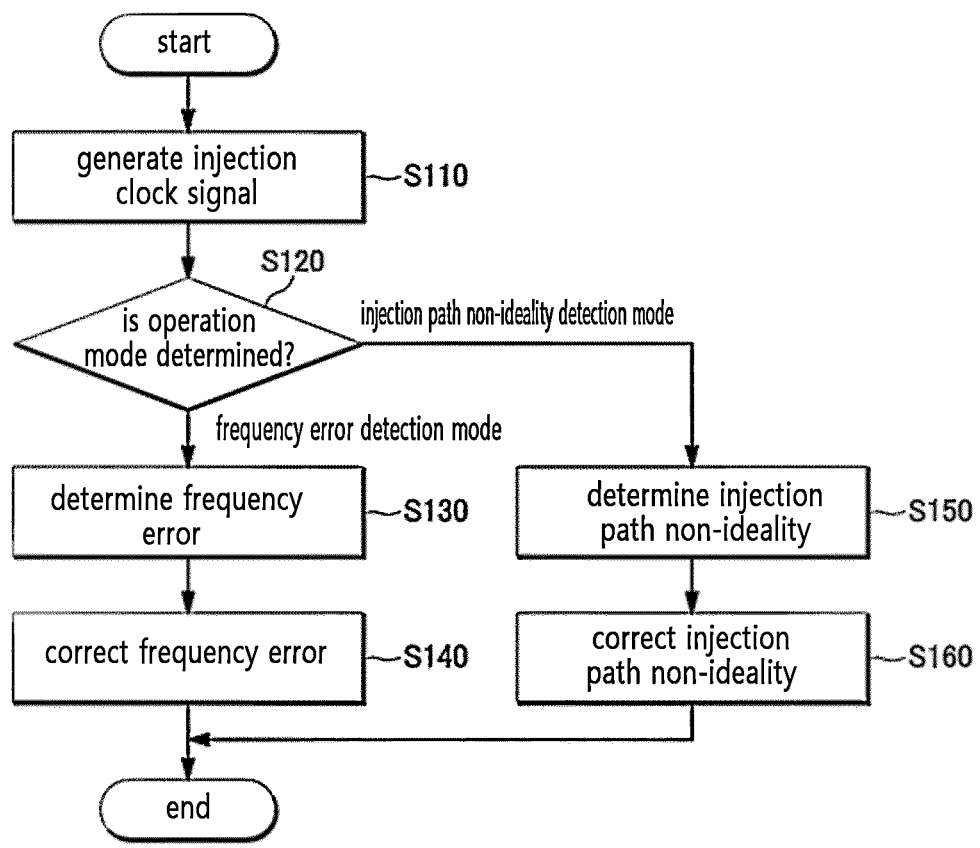
FIG. 5 is a flowchart illustrating an operating method of an injection-locked clock multiplier, according to an embodiment of the present disclosure.
Figure 6:
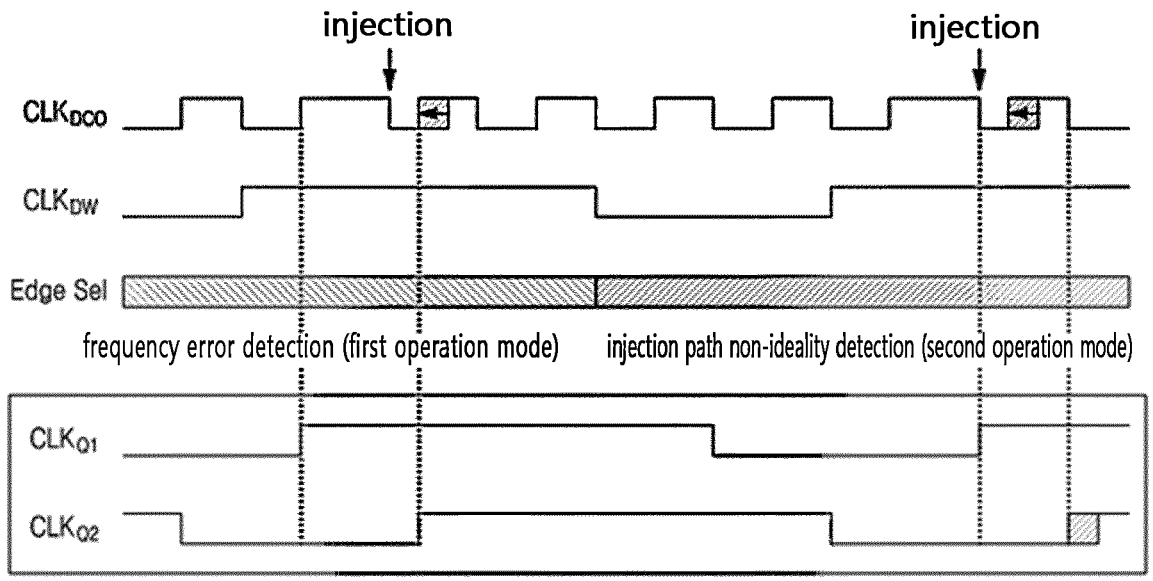
FIG. 6 is a diagram illustrating an error detection process according to an embodiment of the present disclosure.
Figure 7A:
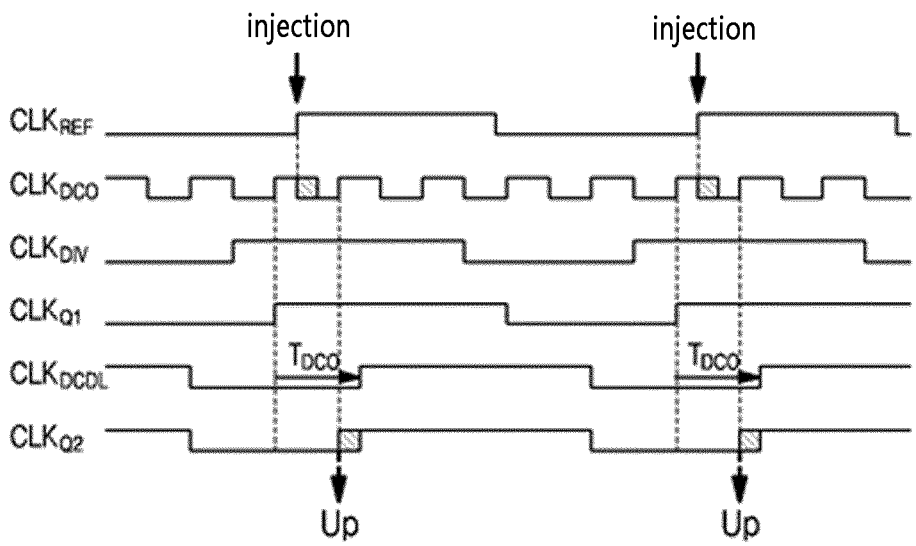
FIGS. 7A and 7B are diagrams illustrating a process of detecting a frequency error, according to an embodiment of the present disclosure.
Figure 7B:
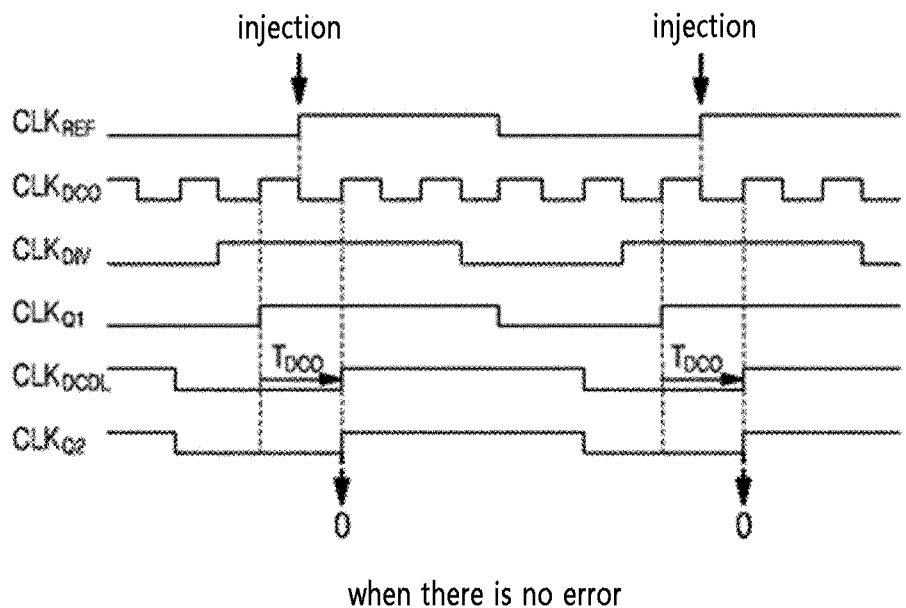
Figure 8A:
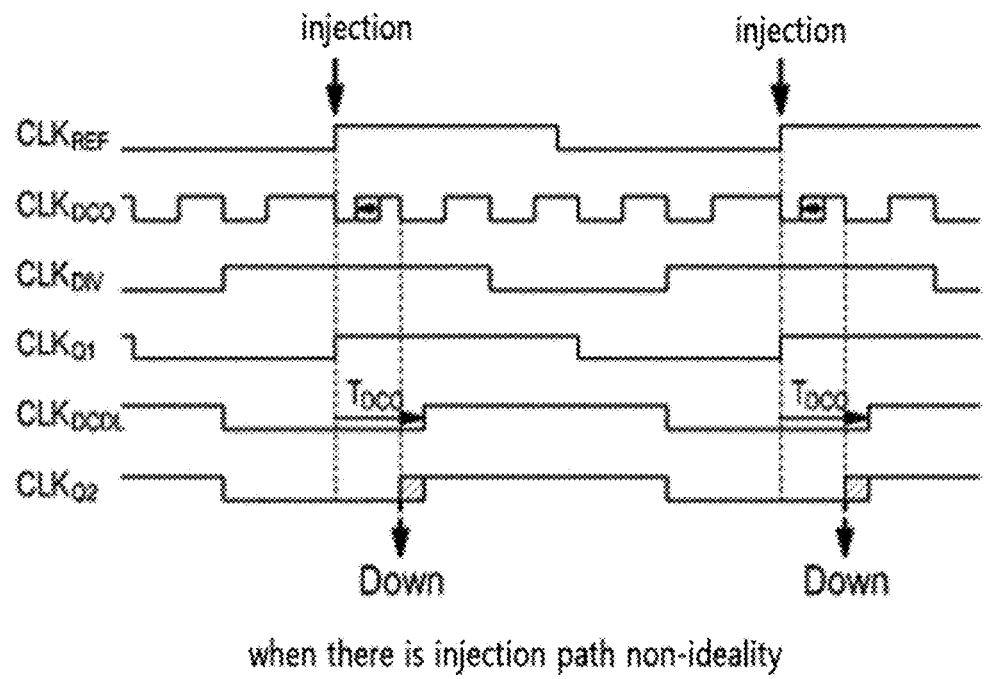
FIGS. 8A and 8B are diagrams illustrating a process of detecting an error due to injection path non-ideality, according to an embodiment of the present disclosure.
Figure 8B:
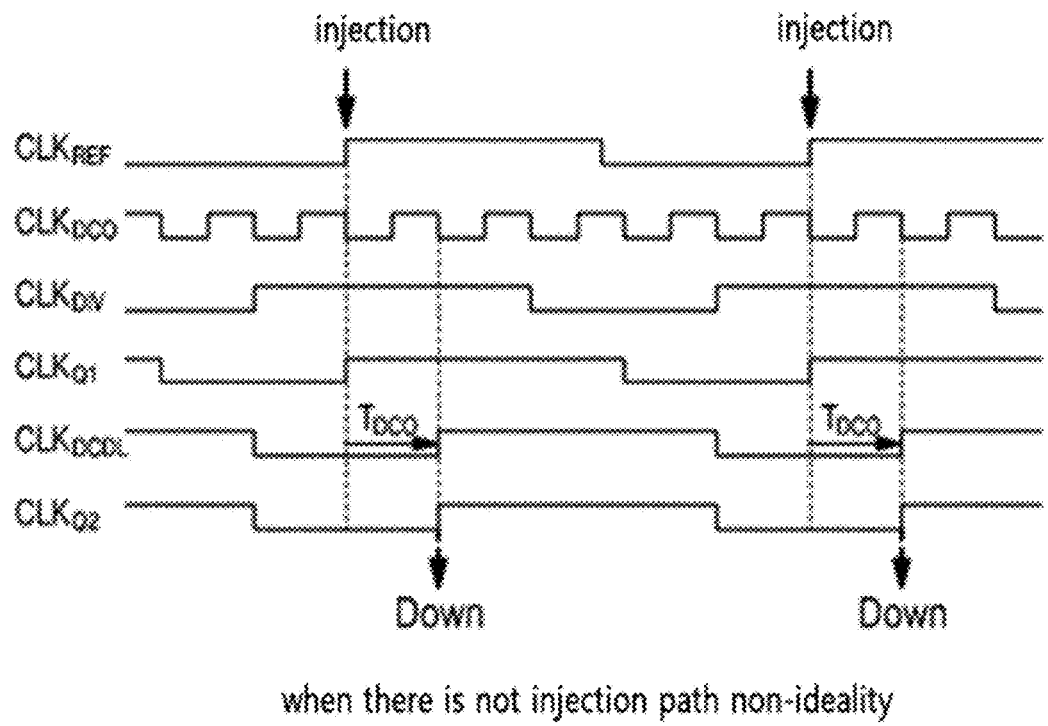

FIG. 5 is a flowchart illustrating an operating method of an injection-locked clock multiplier, according to an embodiment of the present disclosure, FIG. 6 is a diagram illustrating an error detection process according to an embodiment of the present disclosure, FIGS. 7A and 7B are diagrams illustrating a process of detecting a frequency error, according to an embodiment of the present disclosure, and FIGS. 8A and 8B are diagrams illustrating a process of detecting an error due to injection path non-ideality, according to an embodiment of the present disclosure.

First, the oscillator control unit 100 of the injection-locked clock multiplier 10 generates an injection clock signal with a frequency of N times (N is a natural number) the reference clock signal through the oscillator 110 (S110).

In this case, while generating the injection clock signal, the oscillator control unit 100 adjusts the operation of an oscillator based on an operation frequency adjustment signal $DCW_{DCO}$ of the oscillator 110 and the operation cycle adjustment signal $DCW_{PER}$ of the oscillator 110 transmitted from the error adjuster 300, thereby adjusting an output result of the injection clock signal.

Next, the error detector 200 distinguishes the first operation mode and the second operation mode based on the operation mode selection signal output from the error adjuster 300 (S120). As illustrated in FIG. 6, an operation mode selection signal Edge Sel is input to one terminal of the logic operator 220, and thereby the first operation mode and the second operation mode are determined. The operation mode selection signal for selecting the first operation mode may be a low-level signal, and the operation mode selection signal for selecting the second operation mode may be a high-level signal, but it is also possible to design the signals in an opposite case.

Next, referring back to FIG. 5, the frequency error indicating whether the frequency of an injection clock signal corresponds to N times the frequency of a reference clock signal is detected in the first operation mode for detecting a frequency error (S130), and an operation frequency of an oscillator is adjusted based on the frequency error detected in the first operation mode (S140).

In addition, an error due to injection path non-ideality is detected from the injection clock signal in the second operation mode for detecting the error due to injection path non-ideality (S150), and an operation cycle of the oscillator is adjusted based on the error due to injection path non-ideality detected in the second operation mode (S160).

A detailed error detection method will be described with reference to FIGS. 7 and 8.

The injection clock signal $CLK_{DCO}$ with a frequency of N times (five times in the drawings) is input to the frequency divider 210 and the logic operator 220 based on the reference clock signal $CLK_{REF}$.

Accordingly, a result of a logical operation of the operation mode selection signal and the injection clock signal is input as an operation clock of the edge detector 230. In addition, the injection clock signal frequency-divided by the frequency divider 210 is input to the edge detector 230 as data.

As described above, the edge detector 230 includes a first flip-flop 232 that receives the frequency-divided injection clock signal as data and outputs the first clock signal $CLK_{Q1}$ and a second flip-flop 234 that operates in synchronization with a result of an XOR operation of the operation mode selection signal and the injection clock signal, receives the first clock signal $CLK_{Q1}$ as data, and outputs the second clock signal $CLK_{Q2}$. That is, the first flip-flop 232 and the second flip-flop 234 operate in synchronization with an output of the logic operator 220.

When the logic operator 220 is an XOR operator, and when a low-level operation selection signal for activating the first operation mode is input, the edge detector 230 outputs the first clock signal $CLK_{Q1}$ and the second clock signal $CLK_{Q2}$ in synchronization with a rising edge of the injection clock signal $CLK_{DCO}$. In addition, when a high-level operation selection signal for activating the second operation mode is input, the edge detector 230 outputs the first clock signal $CLK_{Q1}$ and the second clock signal $CLK_{Q2}$ in synchronization with a falling edge of the injection clock signal $CLK_{DCO}$. In this case, the first clock signal $CLK_{Q1}$ and the second clock signal $CLK_{Q2}$ are generated to be spaced apart by one cycle based on the injection clock signal.

In addition, as illustrated in FIG. 7A, the error detector 200 detects a frequency error by using a time difference between the first clock signal $CLK_{Q1}$ and the second clock signal $CLK_{Q2}$. In this case, the delayer 240 generates a third clock signal $CLK_{DCDL}$ obtained by delaying the first clock signal $CLK_{Q1}$ by a predetermined delay time. In addition, the phase difference detector 250 detects a time difference between the first clock signal $CLK_{Q1}$ and the second clock signal $CLK_{Q2}$ and a time difference between the first clock signal $CLK_{Q1}$ and the third clock signal $CLK_{DCDL}$, and transmits the comparison result to the error adjuster 300.

That is, the phase difference detector 250 determines whether the time difference between the first clock signal $CLK_{Q1}$ and the second clock signal $CLK_{Q2}$ is greater than the time difference between the first clock signal $CLK_{Q1}$ and the third clock signal $CLK_{DCDL}$, and when the time difference between the first clock signal $CLK_{Q1}$ and the second clock signal $CLK_{Q2}$ is greater than the time difference between the first clock signal $CLK_{Q1}$ and the third clock signal $CLK_{DCDL}$, the phase difference detector 250 transmits a result that the frequency of the injection clock signal is higher than a target frequency, and when the time difference between the first clock signal $CLK_{Q1}$ and the second clock signal $CLK_{Q2}$ is less than the time difference between the first clock signal $CLK_{Q1}$ and the third clock signal $CLK_{DCDL}$, the phase difference detector 250 transmits a result that the frequency of the injection clock signal is lower than a target frequency. When the respective time differences are the same as each other as illustrated in FIG. 7B, it is considered that there is no error.

When the time difference between the first clock signal $CLK_{Q1}$ and the second clock signal $CLK_{Q2}$ is greater than the time difference between the first clock signal $CLK_{Q1}$ and the third clock signal $CLK_{DCDL}$, the error adjuster 300 determines that the frequency of the injection clock signal is higher than a target frequency according to the information transmitted by the phase difference detector 250, and outputs the operation frequency adjustment signal $DCW_{DCO}$ that decreases an operation frequency of the oscillator. In addition, when the time difference between the first clock signal $CLK_{Q1}$ and the second clock signal $CLK_{Q2}$ is less than the time difference between the first clock signal $CLK_{Q1}$ and the third clock signal $CLK_{DCDL}$, the error adjuster 300 determines that the frequency of the injection clock signal is lower than a target frequency, and outputs the operation frequency adjustment signal $DCW_{DCO}$ that increases an operation frequency of the oscillator. When the respective time differences are the same as each other, the control signal that increases or decrease the operating frequency is not output.

A process of detecting an error due to the injection path non-ideality is illustrated in FIGS. 8A and 8B.

As illustrated in FIG. 8A, when the operation selection signal of a high level for activating the second operation mode is input, the edge detector 230 outputs the first clock signal $CLK_{Q1}$ and the second clock signal $CLK_{Q2}$ in synchronization with a falling edge of the injection clock signal $CLK_{DCO}$.

The error detector 200 detects an error due to injection path non-ideality by using the time difference between the first clock signal $CLK_{Q1}$ and the second clock signal $CLK_{Q2}$.

The phase difference detector 250 compares the time difference between the first clock signal $CLK_{Q1}$ and the second clock signal $CLK_{Q2}$ with the time difference between the first clock signal $CLK_{Q1}$ and the third clock signal $CLK_{DCDL}$, and when the time difference between the first clock signal $CLK_{Q1}$ and the second clock signal $CLK_{Q2}$ is greater than the time difference between the first clock signal $CLK_{Q1}$ and the third clock signal $CLK_{DCDL}$, the phase difference detector 250 transmits a result that a frequency of the injection clock signal is higher than a target frequency, and when the time difference between the first clock signal $CLK_{Q1}$ and the second clock signal $CLK_{Q2}$ is less than the time difference between the first clock signal $CLK_{Q1}$ and the third clock signal $CLK_{DCDL}$, the phase difference detector 250 transmits a result that a frequency of the injection clock signal is lower than a target frequency. When the respective time differences are the same as each other as illustrated in FIG. 7B, it is considered that there is no error.

When the time difference between the first clock signal $CLK_{Q1}$ and the second clock signal $CLK_{Q2}$ is greater than the time difference between the first clock signal $CLK_{Q1}$ and the third clock signal $CLK_{DCDL}$, the error adjuster 300 determines that an edge is temporarily output slowly immediately after injection and increases and outputs the operation cycle adjustment signal $DCW_{PER}$ for adjusting a cycle immediately after injection. In addition, when the time difference between the first clock signal $CLK_{Q1}$ and the second clock signal $CLK_{Q2}$ is less than the time difference between the first clock signal $CLK_{Q1}$ and the third clock signal $CLK_{DCDL}$, the error adjuster 300 determines that an edge is temporarily output fast immediately after injection and decreases and outputs the operation cycle adjustment signal $DCW_{PER}$ for adjusting a cycle immediately after injection. When the respective time differences are the same as each other, a control signal for increasing or decreasing an operation cycle is not output.

An embodiment of the present disclosure may be implemented in the form of a recording medium including instructions executable by a computer, such as a program module executed by a computer. A computer readable medium may be any available medium that may be accessed by a computer and includes both volatile and nonvolatile media, removable and non-removable media. Also, the computer readable medium may include a computer storage medium. A computer storage medium includes both volatile and nonvolatile media and removable and non-removable media implemented by any method or technology for storing information, such as computer readable instructions, data structures, program modules or other data.

Although the method and system of the present disclosure are described with respect to specific embodiments, some or all of components or operations thereof may be implemented by using a computer system having a general-purpose hardware architecture.

The above descriptions of the present disclosure are for illustrative purposes only, and those skilled in the art to which the present disclosure belongs will understand that the present disclosure may be easily modified into another specific form without changing the technical idea or essential features of the present disclosure. Therefore, the embodiments described above should be understood as illustrative in all respects and not limiting. For example, each component described as a single type may be implemented in a distributed manner, and similarly, components described in a distributed manner may also be implemented in a combined form.

The scope of the present disclosure is indicated by the following claims rather than the detailed description above, and the meaning and scope of the claims and all changes or modifications derived from the equivalent concepts should be interpreted as being included in the scope of the present disclosure.

BRIEF DESCRIPTION OF THE SIGNS

10: The injection-locked clock multiplier
100: The oscillator control unit
110: an oscillator 200: the error detector
210: a frequency divider
220: a logic operator
240: a delayer
250: a phase difference detector
300: the error adjuster

What is claimed is:

1. An injection-locked clock multiplier comprising:
an oscillator control unit configured to output an injection clock signal with a frequency of N times (N is a natural number) a reference clock signal through an oscillator;
an error detector configured to detect a frequency error indicating whether a frequency of the injection clock signal corresponds to the N times the frequency of the reference clock signal in a first operation mode and configured to detect an error due to injection path non-ideality from the injection clock signal in a second operation mode; and
an error adjuster configured to receive one of information on the frequency error and information on the error due to the injection path non-ideality from the error detection unit and configured to adjust an operation frequency of the oscillator through the oscillator control unit based on the frequency error or configured to adjust an operation cycle of the oscillator through the oscillator control unit based on the error due to the injection path non-ideality.

2. The injection-locked clock multiplier of claim 1, wherein
the error adjuster outputs an operation mode selection signal for distinguishing the first operation mode and the second operation mode, and
the error detector includes:
a frequency divider configured to divide a frequency of the injection clock signal and output a frequency-divided injection clock signal,
an edge detector configured to output a first clock signal obtained by delaying the frequency-divided injection clock signal by a predetermined time and a second clock signal obtained by delaying the first clock signal by a predetermined time in synchronization with a logic operation result of the operation mode selection signal and the injection clock signal,
a delayer configured to output a third clock signal obtained by delaying the first clock signal by a predetermined time, and
a phase difference detector configured to detect the frequency error or the error due to the injection path non-ideality by comparing a time difference between the first clock signal and the second clock signal with a time difference between the first clock signal and the third clock signal.

3. The injection-locked clock multiplier of claim 2, wherein,
when the operation mode selection signal indicating the first operation mode is activated, the edge detector outputs the first clock signal and the second clock signal in synchronization with a rising edge of the injection clock signal, and the phase difference detector outputs the frequency errors, and
when the operation mode selection signal indicating the second operation mode is activated, the edge detector outputs the first clock signal and the second clock signal in synchronization with a falling edge of the injection clock signal, and the phase difference detector outputs the error due to the injection path non-ideality.

4. The injection-locked clock multiplier of claim 3, wherein,
when the operation mode selection signal indicating the first operation mode is activated, and when the time difference between the first clock signal and the second clock signal is greater than the time difference between the first clock signal and the third clock signal, the error adjuster outputs a control signal that decreases the operation frequency of the oscillator, and
when the time difference between the first clock signal and the second clock signal is less than the time difference between the first clock signal and the third clock signal, the error adjuster outputs the control signal that increases the operation frequency of the oscillator.

5. The injection-locked clock multiplier of claim 3, wherein,
when the operation mode selection signal indicating the second operation mode is activated, and when the time difference between the first clock signal and the second clock signal is greater than the time difference between the first clock signal and the third clock signal, the error adjuster increases and outputs a control signal for controlling a cycle immediately after injection, and
when the time difference between the first clock signal and the second clock signal is less than the time difference between the first clock signal and the third clock signal, the error adjuster decreases and outputs the control signal for controlling the cycle immediately after injection.

6. The injection-locked clock multiplier of claim 2, wherein the edge detector includes:
a first flip-flop configured to operate in synchronization with an XOR operation result of the operation mode selection signal and the injection clock signal, receive the frequency-divided injection clock signal as data, and output the first clock signal; and
a second flip-flop configured to operate in synchronization with the XOR operation result of the operation mode selection signal and the injection clock signal, receive the first clock signal as data, and output the second clock signal.

7. The injection-locked clock multiplier of claim 2, wherein
the operation mode selection signal for executing the second operation mode is activated once while the operation mode selection signal for executing the first operation mode is activated 15 times.

8. The injection-locked clock multiplier of claim 2, wherein
a delay time of the delayer is adjusted by the error adjuster.

9. A method of operating an injection-locked clock multiplier, the method comprising:
generating an injection clock signal with a frequency of N times (N is a natural number) a reference clock signal through an oscillator;
detecting a frequency error indicating whether a frequency of the injection clock signal corresponds to the N times the frequency of the reference clock signal in a first operation mode;
detecting an error due to injection path non-ideality from the injection clock signal in a second operation mode;
adjusting an operation frequency of the oscillator based on the frequency error detected in the first operation mode; and adjusting an operation cycle of the oscillator based on the error due to the injection path non-ideality detected in the second operation mode.

10. The method of claim 9, wherein
the detecting of the frequency error includes generating a first clock signal obtained by delaying a frequency-divided injection clock signal by a predetermined time, a second clock signal obtained by delaying the first clock signal by a predetermined time through a flip-flop, and a third clock signal obtained by delaying the first clock signal by a predetermined time through a delayer in synchronization with a rising edge of the injection clock signal, and detecting the frequency error by comparing a time difference between the first clock signal and the second clock signal with a time difference between the first clock signal and the third clock signal, and
the detecting of the error due to the injection path non-ideality includes generating the first clock signal obtained by delaying the frequency-divided injection clock signal by a predetermined time, the second clock signal obtained by delaying the first clock signal by a predetermined time through the flip-flop, and the third clock signal obtained by delaying the first clock signal by a predetermined time through the delayer in synchronization with the rising edge of the injection clock signal, and detecting the error due to the injection path non-ideality by comparing the time difference between the first clock signal and the second clock signal with the time difference between the first clock signal and the third clock signal.

11. The method of claim 10, wherein
the adjusting of the operation frequency includes outputting a control signal for decreasing the operation frequency of the oscillator when the time difference between the first clock signal and the second clock signal is greater than the time difference between the first clock signal and the third clock signal, and outputting the control signal for increasing the operation frequency of the oscillator when the time difference between the first clock signal and the second clock signal is less than the time difference between the first clock signal and the third clock signal, and
the adjusting the operation cycle includes increasing and outputting the control signal for controlling a cycle immediately after injection when the time difference between the first clock signal and the second clock signal is greater than the time difference between the first clock signal and the third clock signal, and decreasing and outputting the control signal for controlling the cycle immediately after injection when the time difference between the first clock signal and the second clock signal is less than the time difference between the first clock signal and the third clock signal.

12. The method of claim 9, wherein
the detecting of the error due to the injection path non-ideality and the adjusting the operation cycle are performed at a rate of once while the detecting of the frequency error and the adjusting of the operation frequency are performed 15 times.

* * * * *